United States Patent [19]
Gulliver et al.

[11] Patent Number: 5,126,693
[45] Date of Patent: Jun. 30, 1992

[54] CIRCUIT AND METHOD OF REDUCING PHASE JITTER IN A PHASE LOCK LOOP

[75] Inventors: William H. Gulliver, Gilbert; Carl C. Hanke, Mesa, both of Ariz.

[73] Assignee: Motorola, Inc., Schaumburg, Ill.

[21] Appl. No.: 756,721

[22] Filed: Sep. 9, 1991

[51] Int. Cl.⁵ .............................................. H03L 7/18
[52] U.S. Cl. ...................................... 331/14; 331/18; 331/25
[58] Field of Search ............................. 331/14, 18, 25; 375/120

[56] References Cited

U.S. PATENT DOCUMENTS 4,651,026  3/1987  Serfaty et al. ................. 375/120 X Primary Examiner—Siegfried H. Grimm
Attorney, Agent, or Firm—Robert D. Atkins

[57] ABSTRACT

A phase lock loop (PLL) reduces output phase jitter by averaging an input clock signal and a delayed input clock signal. A control signal selects between the input clock signal and the delayed input clock signal for providing a reference clock signal for the phase lock loop. The output oscillator signal of the PLL is divided by a predetermined integer value for providing the control signal to select between the input clock signal and the delayed input clock signal. The PLL establishes phase lock to the input clock signal during a first state of the control signal. The PLL next establishes phase lock to the delayed input clock signal during a second state of the control signal such that the average value of the output clock signal of the PLL is substantially constant.

20 Claims, 2 Drawing Sheets

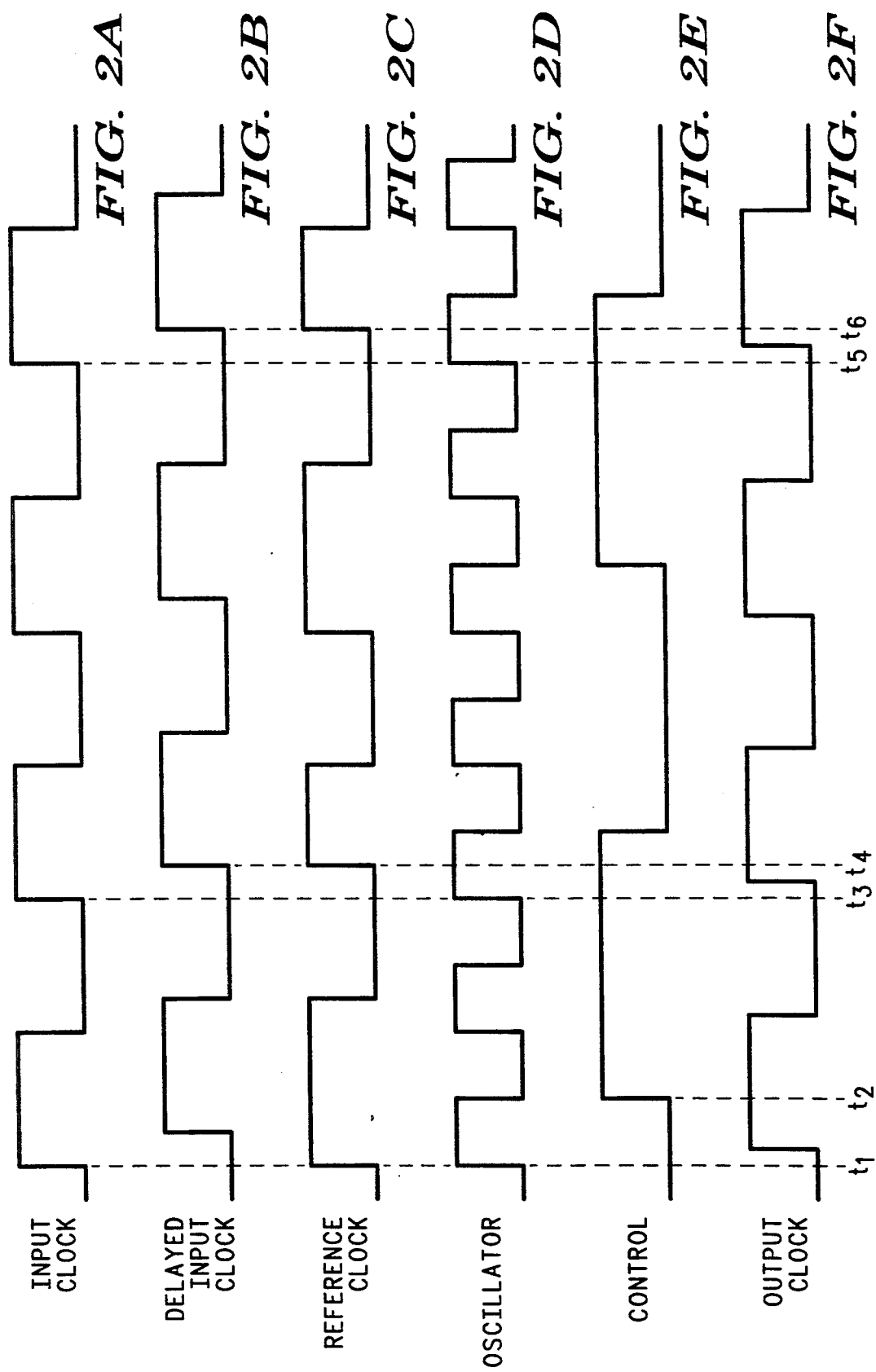

CIRCUIT AND METHOD OF REDUCING PHASE JITTER IN A PHASE LOCK LOOP

BACKGROUND OF THE INVENTION

This invention relates in general to phase lock loops and, more particularly, to a circuit and method of reducing phase jitter in a phase lock loop.

Phase lock loops (PLL) are found in a myriad of electronic applications, such as communication receivers and clock synchronization circuits in computer systems, for providing a reference signal with a known phase for clocking incoming and out-going data. A conventional charge pump PLL comprises a phase detector for monitoring the phase difference between an input clock signal and an output signal from a voltage controlled oscillator (VCO) and generating an up control signal and a down control signal for a charge pump circuit which charges and discharges a loop filter at the input of the VCO. The up and down control signals increase and decrease the VCO output frequency, respectively, to maintain a predetermined phase relationship between signals applied to the phase detector, as is well understood.

A common problem with the conventional PLL is the occurrence of phase jitter at the output of the VCO. When the phase difference between the output signal of the VCO and the input clock signal becomes less than the resolution of the PLL, the phase detector continuously corrects the VCO for the perceived phase error. Thus, the output signal from the VCO jumps back and forth between a phase lead and phase lag with respect to the input clock signal. Such phase jitter reduces the effective bandwidth of the PLL since the output edge location of the output signal from the VCO continuously changes. The phase of the output signal of the VCO is thus only accurate within the jitter window.

Hence, what is needed is an improved phase lock loop which reduces the phase jitter of the output signal from the VCO.

SUMMARY OF THE INVENTION

Briefly stated, the present invention comprises a phase lock loop (PLL) responsive to a reference clock signal for generating an output oscillator signal operating with a predetermined phase relationship relative to the reference clock signal including a delay circuit having an input coupled for receiving an input clock signal and an output for providing a delayed input clock signal. A multiplexer circuit has a first input coupled for receiving the input clock signal, a second input coupled for receiving the delayed input clock signal, a control input for receiving a control signal for selecting between the input clock signal and the delayed input clock signal and an output for providing the reference clock signal applied to the phase lock loop. A first divider circuit has an input coupled for receiving the output oscillator signal of the PLL and an output for providing the control signal to the control input of the multiplexer circuit.

In another aspect, the present invention comprises a method of reducing phase jitter in an output oscillator signal of a phase lock loop operating with a predetermined phase relationship relative to a reference clock signal including the steps of delaying an input clock signal for providing a delayed input clock signal, selecting between the input clock signal and the delayed input clock signal in response to first and second states of a control signal respectively to provide the reference clock signal applied to the phase lock loop, and dividing the output oscillator signal by a predetermined integer value for providing the control signal to select between the input clock signal and the delayed input clock signal.

BRIEF DESCRIPTION OF THE DRAWING

FIGS. 2A-2F is a waveform plot useful in the explanation of the phase lock loop of FIG. 1.

DETAILED DESCRIPTION OF THE PREFERRED EMBODIMENT

Figure 1:
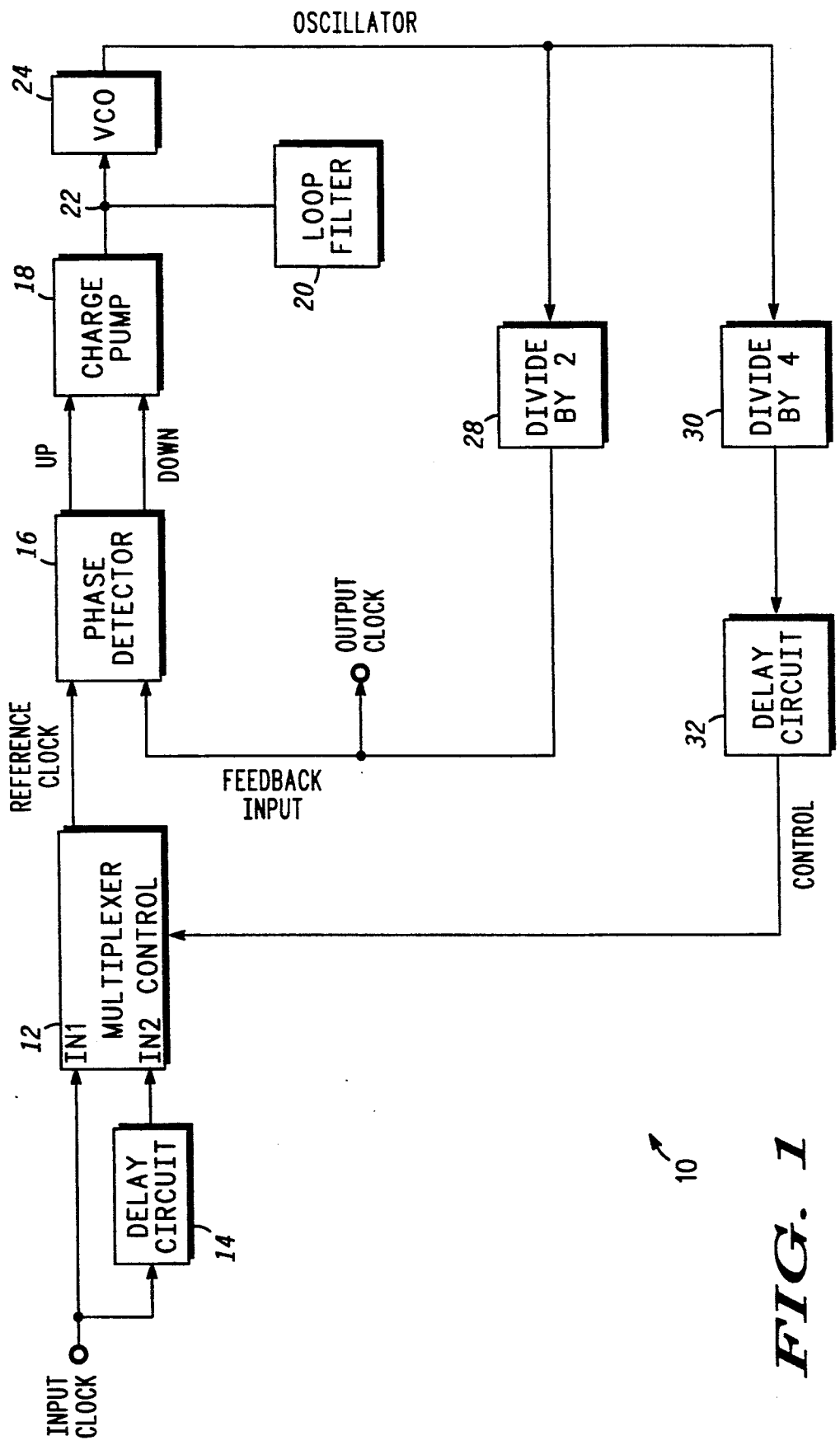
FIG. 1 is a simplified block diagram illustrating a phase lock loop.

A phase lock loop 10 is shown in FIG. 1 responsive to an INPUT CLOCK signal applied at the first input of multiplexer 12. The INPUT CLOCK signal is also delayed through delay circuit 14 and applied to the second input of multiplexer 12. If the frequency of the INPUT CLOCK signal is set to 33 MHz for example, delay circuit 14 may delay the INPUT CLOCK signal for three nanoseconds. Delay circuit 14 is typically implemented with an even number of serially coupled inverters. Multiplexer 12 is responsive to a control signal for selecting between the INPUT CLOCK signal and the delayed INPUT CLOCK signal for providing a REFERENCE CLOCK signal at the first input of phase detector 16. The output of phase detector 16 provides an up control signal and a down control signal to control charge pump 18 which in turn charges and discharges loop filter 20 for developing an error voltage at loop node 22 to control the output frequency of voltage controlled oscillator (vCO) 24. The output oscillator signal provided by VCO 24 is divided through divide-by-two circuit 28 and applied at the second feedback input of phase detector 16. The output signal of divide-by-two circuit 28 is the OUTPUT CLOCK signal of PLL 10.

As part of the present invention, the output signal from VCO 24 is also divided through divide-by-four circuit 30 and further delayed through delay circuit 32 for providing the control signal for multiplexer 12. The time delay for the control signal ensures that the most recent OUTPUT CLOCK signal produced by the previous phase comparison is present at the second feedback input of phase detector 16 before a new REFERENCE CLOCK signal is applied at the first input of the same. Delay circuit 32 may also be implemented as a string of serially coupled inverters for providing a delay of say five nanoseconds.

The waveform plots of FIGS. 2A-2F are useful in the explanation of PLL 10. The INPUT CLOCK signal and the delayed INPUT CLOCK signal are shown in FIGS. 2A and 2B, respectively. At time $t_1$, the control signal is logic zero causing multiplexer 12 to route the INPUT CLOCK signal as the reference clock to phase detector 16 as shown in FIG. 2C. The up control signal and the down control signal control charge pump 18 to adjust error voltage at loop node 22 which controls the output frequency of VCO 24, see FIG. 2D, and moves the phase of the OUTPUT CLOCK signal toward alignment with the REFERENCE CLOCK signal, as derived from the INPUT CLOCK signal.

The frequency of the output signal of VCO 24 is further reduced by divide-by-four circuit 30 and delayed through delay circuit 32 for providing the control signal, as shown in FIG. 2E, which changes state at time t₂ to pass the delayed INPUT CLOCK signal through multiplexer 12 to the first input of phase detector 16 as the REFERENCE CLOCK signal. Again, the up control signal and the down control signal from phase detector 16 control charge pump 18 to change the voltage at loop node 22 and adjust the output signal of VCO 24 to move the phase of the OUTPUT CLOCK signal toward phase alignment with the REFERENCE CLOCK signal, as derived from the delayed INPUT CLOCK signal.

Thus, during four periods of the output signal of VCO 24, the OUTPUT CLOCK signal is adjusted toward phase alignment with the INPUT CLOCK signal and during the following four periods of the output signal of VCO 24, the OUTPUT CLOCK signal is moved toward phase alignment with the delayed INPUT CLOCK signal. The average value of the OUTPUT CLOCK signal settles approximately midway between the transitions of the INPUT CLOCK signal and the delayed INPUT CLOCK signal, see FIG. 2F between times t₃ and t₄. With the delay through delay circuit 14 set at a value greater than the phase resolution of PLL 10, the phase jitter is overcome by the averaging effect on the OUTPUT CLOCK signal. It is understood that the divider ratios of divider circuits 28 and 30 may be selected at an appropriate value other than two and four, respectively.

Hence, what has been provided is a novel phase lock loop which averages the phases between an input clock signal and a delayed input clock signal and thereby overcomes any phase jitter in the output clock signal.

We claim:

1. A phase lock loop (PLL) responsive to a reference clock signal for generating an output signal operating with a predetermined phase relationship relative to the reference clock signal, comprising:
  delay means having an input coupled for receiving an input clock signal and an output for providing a delayed input clock signal;
  a multiplexer circuit having first and second inputs, an output and a control input, said first input being coupled for receiving said input clock signal, said second input being coupled for receiving said delayed input clock signal, said control input receiving a control signal for selecting between said input clock signal and said delayed input clock signal, said output providing the reference clock signal applied to the phase lock loop; and
  a first divider circuit having an input coupled for receiving the output signal of the PLL and having an output for providing said control signal to said control input of said multiplexer circuit.

2. The phase lock loop of claim 1 further including a first delay circuit coupled between said output of said first divider circuit and said control input of said multiplexer circuit.

3. The phase lock loop of claim 2 further including:
  phase comparing means having first and second inputs and an output, said first input being coupled to said output of said multiplexer circuit;
  a voltage controlled oscillator having an input coupled to said output of said phase comparing means and having an output; and
  a second divider circuit coupled between said output of said voltage controlled oscillator and said second input of said phase comparing means for providing an output clock signal of the PLL.

4. The phase lock loop of claim 3 wherein said delay means includes a second delay circuit having an input coupled for receiving said input clock signal and having an output coupled to said second input of said multiplexer circuit for providing said delayed input clock signal.

5. The phase lock loop of claim 4 wherein the time difference between said input clock signal and said delayed input clock signal is greater than the phase resolution of the PLL.

6. The phase lock loop of claim 5 wherein said phase comparing means receives said input clock signal during a first state of said control signal.

7. The phase lock loop of claim 6 wherein said phase comparing means receives said delayed input clock signal during a second state of said control signal such that the average value of said output clock signal of the PLL is substantially constant.

8. A phase lock loop (PPL), comprising:
  delay means having an input coupled for receiving an input clock signal and an output for providing a delayed input clock signal;
  a multiplexer circuit having first and second inputs, an output and a control input, said first input being coupled for receiving said input clock signal, said second input being coupled for receiving said delayed input clock signal, said control input receiving a control signal for selecting between said input clock signal and said delayed input clock signal at said output;
  phase comparing means having first and second inputs and an output, said first input being coupled to said output of said multiplexer circuit;
  a voltage controlled oscillator having an input coupled to said output of said phase comparing means and having an output coupled to said second input of said phase comparing means; and
  a first divider circuit having an input coupled to said output of said voltage controlled oscillator and having an output for providing said control signal to said control input of said multiplexer circuit.

9. The phase lock loop of claim 8 further including a first delay circuit coupled between said output of said first divider circuit and said control input of said multiplexer circuit.

10. The phase lock loop of claim 9 further including a second divider circuit coupled between said output of said voltage controlled oscillator and said second input of said phase comparing means for providing an output clock signal.

11. The phase lock loop of claim 10 wherein the time difference between said input clock signal and said delayed input clock signal is greater than the resolution of the PLL.

12. The phase lock loop of claim 11 wherein the PLL establishes phase lock to said input clock signal during a first state of said control signal.

13. The phase lock loop of claim 12 wherein the PLL establishes phase lock to said delayed input clock signal during a second state of said control signal such that the average value of said output clock signal is substantially constant.

14. The phase lock loop of claim 13 wherein said phase comparing means includes:
  a phase detector having first and second inputs and first and second outputs, said first input being coupled to said output of said multiplexer circuit, said second input being coupled to said output of said second divider circuit, said first output providing an up control signal, said second output providing a down control signal;

a charge pump circuit having first and second inputs and an output, said first input being coupled to said first output of said phase detector for receiving said up control signal, said second input being coupled to said second output of said phase detector for receiving said down control signal, said output being coupled to said input of said voltage controlled oscillator; and a loop filter coupled to said output of said charge pump circuit.

15. The phase lock loop of claim 14 wherein said delay means includes a second delay circuit having an input coupled for receiving said input clock signal and having an output coupled to said second input of said multiplexer circuit for providing said delayed input clock signal.

16. A method of reducing phase jitter in an output signal of a phase lock loop (PPL) operating with a predetermined phase relationship relative to a reference clock signal, comprising the steps of:

delaying an input clock signal for providing a delayed input clock signal;

selecting between said input clock signal and said delayed input clock signal in response to first and second states of a control signal respectively to provide the reference clock signal of the phase lock loop; and dividing the output signal by a first predetermined integer value for providing said control signal to select between said input clock signal and said delayed input clock signal.

17. The method of claim 16 further including the step of dividing the output signal by a second predetermined integer value for providing an output clock signal.

18. The method of claim 17 wherein the time difference between said input clock signal and said delayed input clock signal is greater than the resolution of the PLL.

19. The method of claim 18 wherein the PLL operates with said input clock signal during said first state of said control signal.

20. The method of claim 19 wherein the PLL operates with said delayed input clock signal during said second state of said control signal such that the average value of said output clock signal is substantially constant.

* * * * *